(12) United States Patent
Corea et al.

(10) Patent No.: US 12,183,990 B2
(45) Date of Patent: Dec. 31, 2024

(54) TRANSMISSION LINE COUPLED ANTENNA AND DETUNING CIRCUIT

(71) Applicant: Inkspace Imaging, Inc., Pleasanton, CA (US)

(72) Inventors: Joseph Russell Corea, Fremont, CA (US); Gillian Gentry Haemer, Pleasanton, CA (US); Pulkit Malik, Dublin, CA (US); Tracy Allyn Wynn, Pleasanton, CA (US)

(73) Assignee: Inkspace Imaging, Inc., Pleasanton, CA (US)

( * ) Notice: Subject to any disclaimer, the term of this patent is extended or adjusted under 35 U.S.C. 154(b) by 169 days.

(21) Appl. No.: 18/109,728

(22) Filed: Feb. 14, 2023

(65) Prior Publication Data

US 2023/0261375 A1 Aug. 17, 2023

Related U.S. Application Data

(60) Provisional application No. 63/310,867, filed on Feb. 16, 2022.

(51) Int. Cl.
*G01R 33/34* (2006.01)
*H01Q 3/44* (2006.01)

(52) U.S. Cl.
CPC ............ *H01Q 3/443* (2013.01); *G01R 33/34* (2013.01)

(58) Field of Classification Search
CPC ................................ H01Q 3/443; G01R 33/34
See application file for complete search history.

(56) References Cited

U.S. PATENT DOCUMENTS

| 4,782,298 A | 11/1988 | Arakawa et al. |
| 4,793,356 A | 12/1988 | Misic et al. |

(Continued)

FOREIGN PATENT DOCUMENTS

| KR | 20140098005 | 8/2014 |
| WO | 2008078270 | 7/2008 |

(Continued)

OTHER PUBLICATIONS

"International Application Serial No. PCT US2023 013040, International Search Report mailed Jun. 7, 2023", 3 pgs.

(Continued)

*Primary Examiner* — Henry Luong
(74) *Attorney, Agent, or Firm* — Schwegman Lundberg & Woessner, P.A.

(57) ABSTRACT

A radio frequency (RF) circuit is provided for use with a magnetic resonance imaging (MRI) scanner to transmit an RF receive signal to an amplifier circuit, the RF circuit comprising: a transmission line; an antenna electrically connected to a first end portion of the transmission line; an impedance transformation circuit; an impedance matching and detuning circuit electrically connected between the transmission line and the impedance transformation circuit, wherein the impedance matching and detuning circuit includes: multiple reactive impedance elements; and two or more switches operable to controllably switch between configuring the multiple reactive impedance elements to cause matching of overall impedance of the RF circuit to a prescribed input impedance seen at the amplifier circuit at a prescribed RF frequency during a receive mode of the MRI scanner, and to cause an increase of impedance at the antenna, to reduce sensitivity of the antenna to RF signals at the prescribed frequency during an excitation mode of the MRI scanner.

32 Claims, 8 Drawing Sheets

(56) References Cited

U.S. PATENT DOCUMENTS

| | | | |
|---|---|---|---|
| 5,166,618 A | 11/1992 | Jones et al. | |
| 6,414,488 B1 | 7/2002 | Chmielewski | |
| 6,747,425 B2 | 6/2004 | Marshall, III et al. | |
| 6,850,067 B1 | 2/2005 | Burl et al. | |
| 8,013,609 B2 | 9/2011 | Vartiovaara | |
| 8,046,046 B2 | 10/2011 | Chan et al. | |
| 9,791,527 B2 | 10/2017 | Greim | |
| 10,613,164 B2 | 4/2020 | Xie et al. | |
| 2010/0225320 A1* | 9/2010 | Lazar | G01R 33/3628 324/318 |
| 2012/0223709 A1 | 9/2012 | Schillak et al. | |
| 2013/0285659 A1 | 10/2013 | Sohn et al. | |
| 2014/0210466 A1 | 7/2014 | Arias et al. | |
| 2017/0104548 A1 | 4/2017 | Valdes Garcia et al. | |
| 2020/0158800 A1 | 5/2020 | Taracila et al. | |

FOREIGN PATENT DOCUMENTS

| | | |
|---|---|---|
| WO | 2017112443 | 6/2017 |
| WO | 2023158637 | 8/2023 |

OTHER PUBLICATIONS

"International Application Serial No. PCT US2023 013040, Written Opinion mailed Jun. 7, 2023", 4 pgs.

\* cited by examiner

TRANSMISSION LINE COUPLED ANTENNA AND DETUNING CIRCUIT

RELATED APPLICATIONS

The present application claims the benefit of U.S. Provisional Patent Application, Ser. No. 63/310,867, filed Feb. 16, 2022, entitled, "Failsafe Remote Matching and Blocking Circuit for Magnetic Resonance Imaging Surface Coils," which is hereby incorporated by reference in its entirety.

BACKGROUND

Magnetic Resonance Imaging (MRI) is used to image biological tissue by creating an environment where a nuclear magnetic resonance (NMR) signal is generated. To do this, a sample, e.g., a patient or animal, is first placed in a uniform magnetic field ($B_0$), which is oriented along the Z axis in x/y/z Cartesian space, to create a net magnetic moment parallel to the field of the sample's nuclear magnetic spins. While in the $B_0$ field, a high-power radio frequency (RF) excitation pulse of energy is applied to create Larmor precession of protons in the x-y plane. This is known as the transmit mode of an MRI scan, with the applied RF excitation pulse, commonly referred to as the transmit pulse, as the transmit field, or as the $B_1^+$ field. This transmit pulse is applied at a frequency known as the Larmor frequency, determined by the field strength ($B_0$) of the scanner and the gyromagnetic ratio of the sample's atomic nuclei of interest following the equation below, where γ is a known constant for a given element:

$$f_{larmor} = B_0 * (\gamma/2\pi)$$

Due to the abundance of water in the human body and the nuclear properties of hydrogen, the majority of clinical MR images are acquired using the signals from hydrogen nuclei (γ=42.6 MHz/Tesla). Therefore, for clinical MRI at 1.5 T and 3 T, $f_{larmor}$ is approximately 64 MHz and 128 MHz, respectively.

Once the transmit field is turned off, the excited nuclei will gradually relax back to their resting state, oriented parallel to the $B_0$ field. This period of gradual relaxation is known as the RF receive mode of an MRI scan. The transmit field excitation pulse(s) cause the spins of the nuclei to be "tipped" creating localized changing magnetic moments at the nuclei. The relaxation causes this created magnetic signal to decay. Differences in decay time between different materials is how MRI achieves contrast between different tissues in the body. The localized changing magnetic moments, can be converted into an electrical signal, referred to as a receive signal, using Faraday's law of induction, by placing a loop of wire near the sample. Loops of wire known as receive antennas, channels, elements, or antennas can be placed at different locations at a sample, e.g., overlaying different portions of a patient's body, to capture magnetic energy emanating from such different locations. In practice other RF antennas that are sensitive to the magnetic and electric fields at the Larmor frequency can also be used as received antennas (e.g. dipole, stripline, birdcage, patch antenna, etc).

Images are acquired in MRI by manipulating the field during the transmit mode of the scan with gradient antennas, which manipulate $B_0$ in the x, y, or z direction in order to encode the spins with spatial information. During the RF receive mode, the resulting signals produced by the nuclei of interest and transformed into electrical RF receive signals in the local receive antennas, which then can be passed to MRI scanner processing circuitry, decoded, and reconstructed into cross-sectional or volumetric images of the sample.

Because the receive signal acquired by the receive antenna is converted directly into images, the quality of the receive signal directly impacts the clinical image quality. To help increase the amount and quality of the receive signal, receive antennas, generally are placed as close to the surface of a sample volume of interest as possible, to increase the amount of Faraday induction that occurs. Receive antennas typically are tuned to be resonant at the Larmor frequency, $f_{larmor}$, by adjusting the amount of inductance and/or capacitance in the receive loop to further increase their sensitivity to the frequency of interest.

However, in order to place a receive antenna as close as possible to the region of interest, a receive antenna ordinarily must be placed directly within the high power transmit field, $B_1^+$. Because the transmit pulse is applied at the Larmor frequency, it is capable of driving a significant current on a receive antenna that is resonant at the Larmor frequency. This current could be capable of distorting the transmit field, destroying the resulting image and presenting a significant safety risk to the patient and to the MRI system. Therefore, to function correctly a surface antenna must be sensitive to the lower power magnetic energy present during relaxation of excited nuclei back to their resting state during the receive portion of the scan and invisible to the high power magnetic energy present during the transmit portion of the scan.

In practice this is generally accomplished by the use of active and passive detuning circuits, often referred to as decoupling or blocking circuits. U.S. Pat. No. 6,747,452, entitled, "Decoupling Circuit for Magnetic Resonance Imaging Local Coils", discloses a local receive antenna operatively coupled to an active decoupling circuit and a passive decoupling circuit. An active detuning circuit typically is switched on and off by an external DC signal supplied through a wire to one or more PIN diodes in a decoupling circuit connected to the surface receive antenna. The PIN diodes act like a solid-state switch for this circuit, which is designed to present a high impedance which effectively detunes the antenna. The DC signal is turned on during the transmit mode of the scan to activate the active detuning circuit to prevent the transmit field from driving large currents onto the receive loop, which could potentially damage sensitive electronics, ruin the image, and/or harm the patient. The DC signal is turned off during the RF receive mode to deactivate the active detuning circuit to permit the loop tuned to the Larmor frequency, to resonate in response to magnetic energy emanating from the sample. A passive detuning circuit typically is used to detune the antenna during the transmit mode when the active detuning circuit fails to operate. Passive detuning often is accomplished using a cross-coupled diode pair, which is biased by a high-power voltage induced on the antenna during the transmit mode of the scan in the absence of an operating active detuning circuit. Thus, the combination of an active detuning circuit and a passive detuning circuit can provide a relatively failsafe mechanism to ensure that a receive antenna remains not resonant during the transmit mode. The active detuning circuit generally acts as the primary mechanism to detune the receive antenna during the transmit mode and the passive detuning circuit generally acts as a backup that automatically detunes the antenna if the active detuning circuit fails to do so during the transmit mode.

Modern MRI receive arrays are often multichannel (i.e., having more than one antenna in close proximity to the patient) to take advantage of modern image acceleration techniques allowing for faster exam times. In multichannel arrays it is necessary to ensure that the channels are isolated from one another so as to minimize RF energy shared between them. More particularly, it is necessary to ensure that current induced on one antenna loop is not parasitically shared in other nearby antenna loops of coils. To prevent this, amplifiers are commonly used in conjunction with receive circuits to present a high impedance at the antennas during the receive mode of an MRI scan. A high impedance at a receive antenna during the receive mode limits current flow within that antenna, which in turn, reduces RF electromagnetic energy transmitted by that antenna, which thereby limits inducing by that antenna of a parasitic current in a nearby antenna.

Both active, passive and amplifier detuning circuits generally are constructed of relatively large discrete components (e.g., inductors, capacitors, and diodes), resulting in relatively large, often fragile circuits. To protect the detuning circuits from mechanical damage, they often are placed in plastic or metal enclosures, which can be relatively large, bulky, heavy, and inflexible. In contrast, because receive antennas ordinarily must be placed as close to the imaging region of interest as possible to maximize image quality, the individual loops themselves typically are constructed to be lightweight and flexible to allow them to easily conform to the sample's contours, e.g., to the contours of a patient's body. Unfortunately, detuning circuitry, which is coupled to a receive antenna and housed in a bulky protective enclosure, can compete for space near a patient's anatomy, limiting the flexibility in placement of the receive antenna and therefore, potentially limiting clinical image quality.

SUMMARY

In one aspect, a radio frequency (RF) circuit is provided for use with a magnetic resonance imaging (MRI) scanner to transmit an RF receive signal to an amplifier circuit. The RF circuit includes a transmission line including a first end portion and a second end portion, an antenna electrically connected in parallel with the transmission line at the first end portion of the transmission line, and an impedance transformation circuit. The RF circuit further includes an impedance matching and detuning circuit electrically connected between the transmission line and the impedance transformation circuit, in parallel with the transmission line at the second end portion of the transmission line, and in parallel with the impedance transformation circuit. The impedance matching and detuning circuit includes multiple reactive impedance elements and two or more switches. The two or more switches are operable to controllably switch between configuring RF connections between the multiple reactive impedance elements, to RF connect a first set of the multiple reactive impedance elements to the second end portion of the transmission line to cause matching of overall impedance of the RF circuit to a prescribed input impedance seen at the amplifier circuit at a prescribed RF frequency during a receive mode of the MRI scanner, and to RF connect a second set of the multiple reactive impedance elements to the second end portion of the transmission line to cause an increase of impedance at the antenna, to reduce sensitivity of the antenna to RF signals at the prescribed frequency during an excitation mode of the MRI scanner.

In another aspect, a radio frequency (RF) circuit is for use with a magnetic resonance imaging (MRI) scanner to transmit an RF receive signal to an amplifier circuit. The RF circuit includes a transmission line including a first end portion and a second end portion, an antenna electrically connected in parallel with the transmission line at the first end portion of the transmission line, and an impedance transformation circuit. The RF circuit includes an impedance matching and detuning circuit electrically connected between the transmission line and the impedance transformation circuit, in parallel with the transmission line at the second end portion of the transmission line, and in parallel with the impedance transformation circuit. The impedance matching and detuning circuit includes: a first reactive impedance element, a second reactive impedance element, and a third reactive impedance element, an active switch that includes a PIN diode electrically connected in series with the third reactive impedance element and a first passive switch that includes a first cross-coupled PIN diode pair electrically connected between the first node and a third node. The series-connected PIN diode and third reactive impedance are electrically connected in parallel with the second end portion of the transmission line, between a first node at a signal conductor of the transmission line and a second node at a relative ground of the transmission line. The first reactive impedance is electrically connected between the first node and the third node. The second reactive impedance is electrically connected between the third node and the second node.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. In addition, the present disclosure may repeat reference numerals and/or letters in the various examples. This repetition is for simplicity and clarity and does not in itself dictate a relationship between the various embodiments and/or configurations discussed.

DETAILED DESCRIPTION

Figure 1:
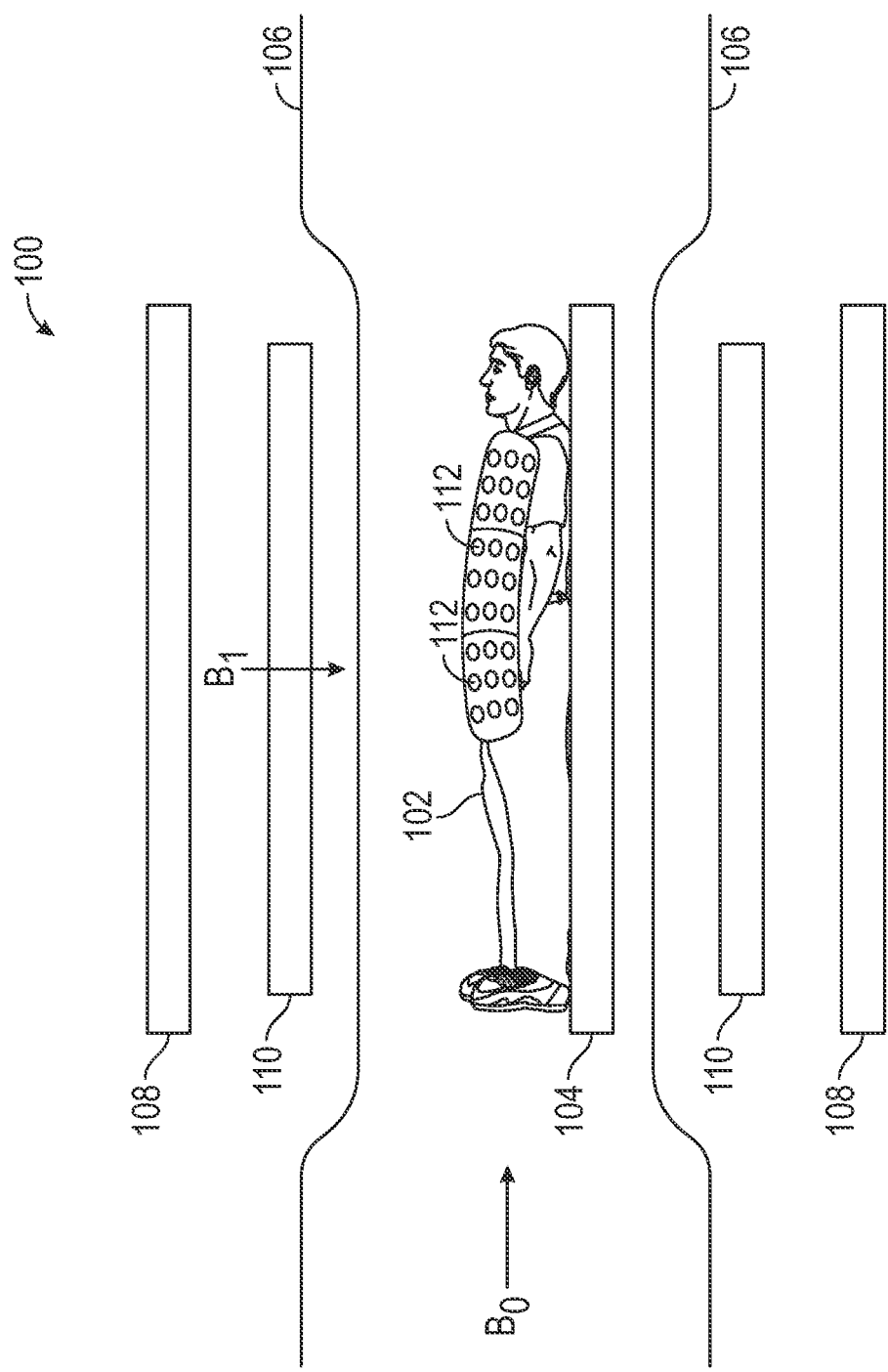
FIG. 1 is an illustrative drawing showing a RF transmit antennas and a RF receive antennas arranged in relation to a patient within an MRI scanner.

FIG. 1 is an illustrative drawing showing a RF transmit antennas 110 and a RF receive antennas 112 arranged in relation to a patient within an MRI scanner system 100. It is noted that in the MRI context, an antenna often is referred to as a "coil". A subject patient 102 is shown laying on a platform 104 within an MRI chamber 106. A main magnet 108 is arranged to produce a static $B_0$ magnetic field. During excitation mode, one or more transmit antennas 110 transmit an excitation magnetic field pulse that produces a $B_1$ magnetic field perpendicular to the static $B_0$ magnetic field at the frequency of interest. Multiple receive antennas 112 are located in close proximity to the patient's body. During RF receive mode, changes in magnetic flux produced by precession of net nuclear magnetization within the subject, following RF-excitation, induces an MR current within the receive antennas 112 that can be post-processed to extract frequency, phase, and amplitude information used to construct an MR image.

Figure 2A:
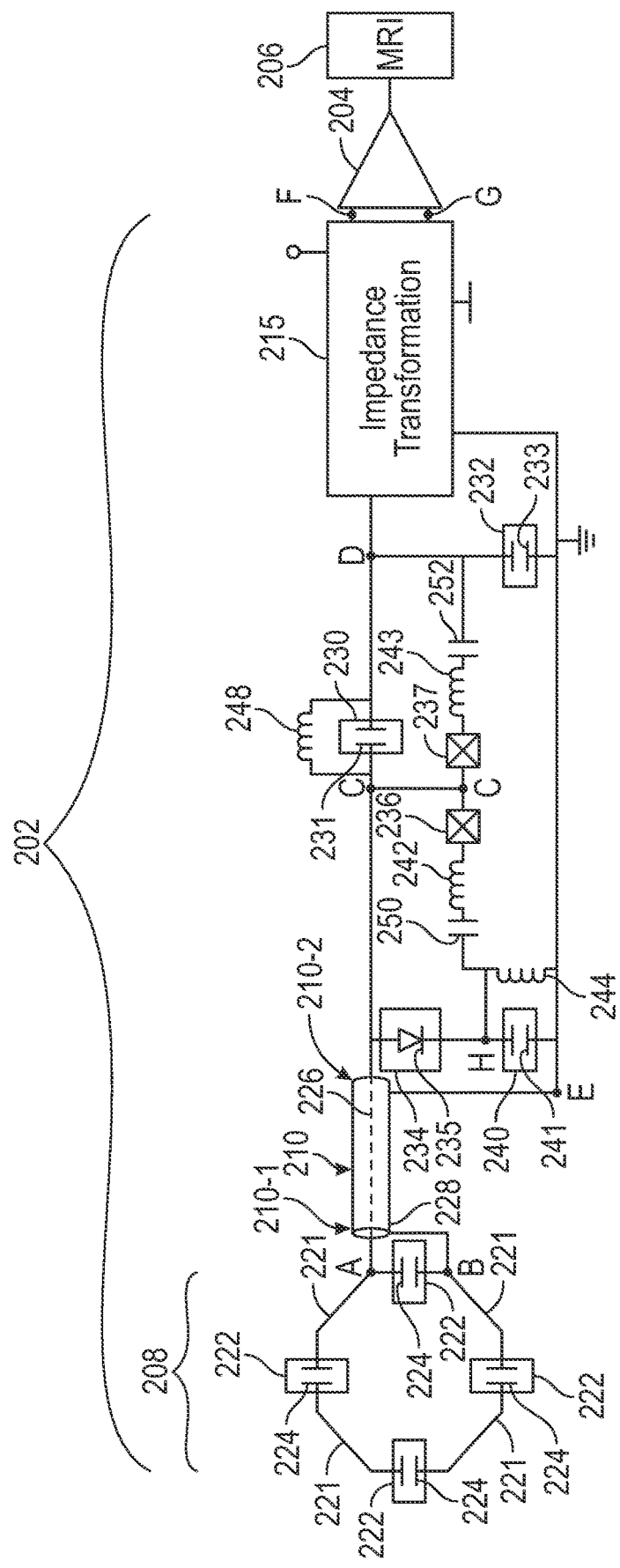
FIG. 2A is an illustrative circuit diagram showing a first example receive circuit, which is operatively coupled to an amplifier circuit, which is operatively coupled to an MRI signal processing system.

FIG. 2A is an illustrative circuit diagram showing a first example receive circuit 202, which is operatively connected to an amplifier circuit 204, which is operatively connected to an MRI signal processing system 206. The receive circuit 202 includes a receive antenna 208, a first transmission line 210 that includes a first end portion 210-1 and a second end portion 210-2, an impedance matching and detuning circuit 212, and an impedance transformation circuit 215. The receive antenna 208 is operatively connected to the first end portion 210-1 of the first transmission line 210. The impedance matching and detuning circuit 212 is operatively connected to the second end portion 210-2 of the first transmission line 210. The impedance transformation circuit 215 is operatively connected between the impedance matching and detuning circuit 212 and the amplifier circuit 204. More particularly a third node, labeled node D, of the impedance matching and detuning circuit 212 and a second node, labeled node E of impedance matching and detuning circuit 212 are electrically connected to input terminals of the impedance transformation circuit 215. Respective first and second output terminals of the impedance transformation circuit 215 are electrically coupled to first and second input terminals of an amplifier circuit 204 at respective nodes F and G. The amplifier circuit 204 includes an output terminal 270 operatively coupled to the MRI signal processing system 206, which can be configured to perform additional amplification, analog-to-digital conversion, and digital signal processing to construct corresponding MRI images.

During receive mode operation, the receive circuit 202 behaves as a matched resonant circuit that presents an input impedance to the amplifier circuit 204 that matches a prescribed input impedance of the amplifier circuit 204 at a prescribed frequency to optimize the amplifier's amplification, that is, to optimize the amplifier's noise figure at the prescribed frequency. The impedance elements of the circuit 202 are selected to achieve a reactance to create resonance and to achieve a specific voltage-current relationship at the input to amplifier 204 at a prescribed frequency. The Larmor frequency is the prescribed frequency in an example receive circuit 202. An example amplifier has a noise-match input impedance of 50 ohms in which case a noise-matched resonant receive circuit 202 would present 50 ohms to the input of the amplifier 204 at the prescribed frequency. Reactive elements of the receive circuit 202 are selected or tuned such that the receive circuit 202 is resonant at a prescribed frequency. That is, a relationship phase between voltage and current of the signal is altered at various parts in the circuit to ultimately achieve a specific relationship at the amplifier 204. An example input to amplifier 204 has a real input impedance (i.e., R=V/I), with substantially no imaginary component, at the prescribed Larmor frequency. The reactive elements of an example receive circuit 202 are selected to transform voltage and current components of an RF receive signal at the Larmor frequency so that they are as in phase as possible at the input to the amplifier 204 in order to optimize amplifier performance at the Larmor frequency.

It is well known in the art that impedance represents relations between voltage and current (i.e., electric and magnetic fields). Impedance is specific to a given frequency. Resistance is the real part, which represents difference in the voltage-current measurement caused by loss to heat. Reactance is the imaginary part, which represents a change in timing of the peaks and valleys of the voltage and current measurements (i.e., phase difference).

The antenna 208, which comprises a loop or coil of conductive material, is positioned within the EM fields produced during MRI scans. The antenna is sensitive to variations in the EM fields at the Larmor frequency. During RF receive mode, magnetic flux from the precession of excited nuclei back to their resting state induces an RF receive signal at the receive signal frequency in the antenna 208. A receive signal at the Larmor frequency is transformed, as explained above, such that the receive circuit 202 is tuned to a specific impedance at the input to the amplifier 204.

An example antenna 208 includes discrete reactive antenna impedance elements 222 electrically connected in a loop configuration by conductors 221. In the example antenna 208, the reactive antenna impedance elements 222 include respective discrete capacitors 224, and the conductors 221, which may exhibit inherent inductive impedance. Alternative reactive antenna impedances (not shown) can include multi-capacitor circuits, inductor circuits, or circuits containing a combination of capacitors and inductors. Different ones of the reactive antenna impedance elements 222 may have different values, and one or more of the antenna reactive impedance elements 222 and/or inductances of conductor segments 221 may be adjustable to tune a resonant frequency of the antenna 208 to a prescribed receive signal frequency such as to a Larmor frequency used by the example MRI scanner 100.

An example first transmission line 210 comprises a coaxial cable. A respective one of the antenna reactive impedance elements 224 indicated within lines 222 is electrically connected in parallel with the first end portion 210-1 of the first transmission line 210, between a fifth node, labelled node A, at a first end portion of an inner coaxial signal conductor 226 (indicated by lines) and a sixth node, labelled node B, at a first end portion of an outer coaxial relative ground 228. An alternative example first transmission line (not shown) may comprise a twisted pair, microstrip, or strip line, for example.

Figure 3:
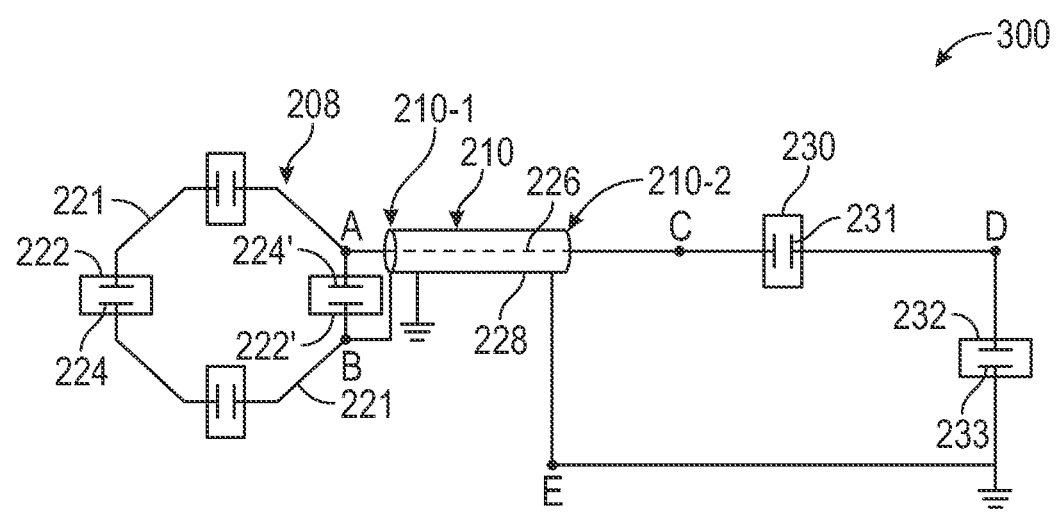
FIG. 3 is an illustrative drawing of an example effective RF receive mode circuit configuration of the receive circuit of FIG. 2A.
Figure 4:
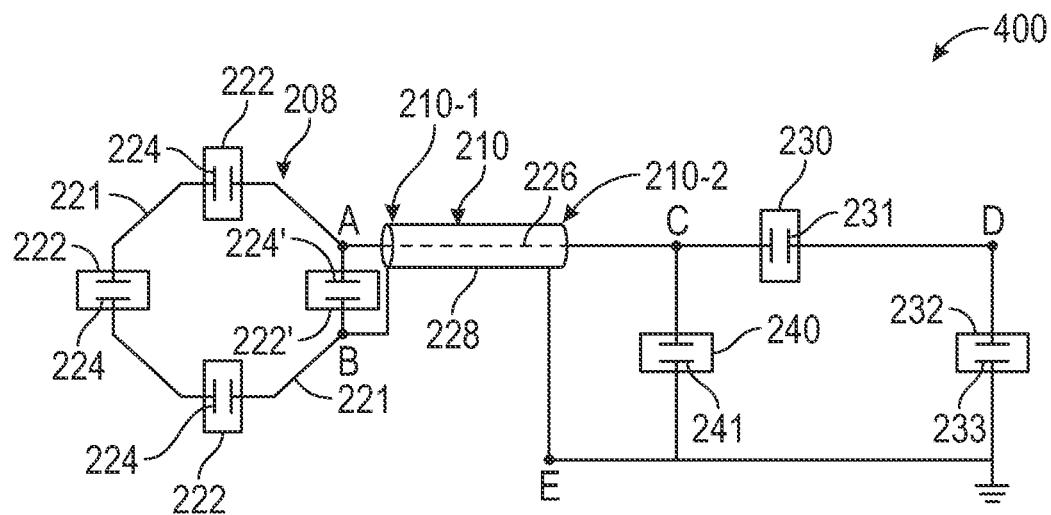
FIG. 4 is an illustrative drawing of an effective RF active detuning mode circuit configuration of the receive circuit of FIG. 2A.
Figure 5:
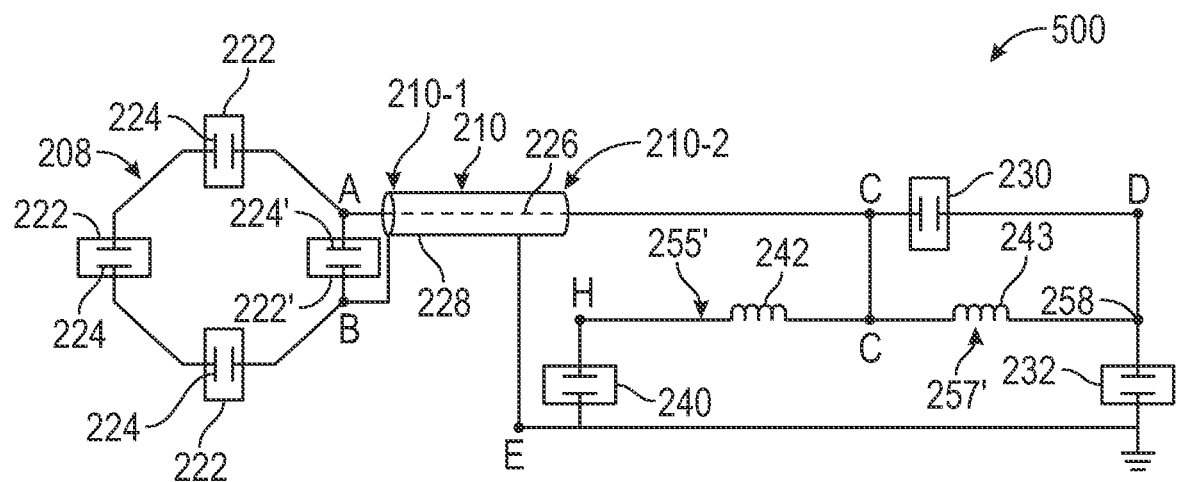
FIG. 5 is an illustrative drawing of an effective RF passive detuning mode circuit configuration of the receive circuit of FIG. 2A.

An example impedance transformation circuit 215 includes reactive circuit elements configured to present an input impedance at the amplifier circuit 204 that matches a prescribed input impedance of the amplifier circuit 204 at a prescribed frequency to optimize the amplifier's amplification, that is, to optimize the amplifier's noise figure at the prescribed frequency. Moreover, an example impedance transform circuit 215 is configured to transform a small input impedance of the amplifier 204 to a higher impedance at the antenna 208 located at the first end portion 210-1 of the first transmission line. (e.g., an impedance presented by the amplifier 204 to the antenna 208) for amplifier decoupling, to minimize current in the antenna 208 to prevent the antenna 208 from producing parasitic RF signal coupling at one or more other nearby antennas (not shown). It will be appreciated that a configuration of reactive impedance elements to achieve impedance matching and transformation of amplifier impedance sufficient to block current in the antenna 208 will be understood by persons skilled in the art and depends upon specific physical and electrical implementation of the receive circuit 202 and characteristics of amplifier 204. During receive mode operation of the MRI scanner 100, certain reactive impedance elements of the impedance matching and detuning circuit 212 together with the impedance transformation circuit 215 are operative to match impedance of the receive circuit 202 to a prescribed impedance seen at the amplifier circuit 204 at a prescribed frequency, e.g., the Larmor frequency. During operation of the MRI scanner 100 in excitation mode, certain reactive impedance elements of the impedance matching and detuning circuit 212 are operative to detune the receive circuit 202 from resonance at the prescribed frequency. An example impedance matching and detuning circuit 212 can achieve RF detuning during the excitation mode through either active detuning or passive detuning. RF operation of the receive circuit is explained with reference to FIGS. 3-5. FIG. 3 is an illustrative drawing of an RF receive mode circuit 300 showing only those components of the detuning and impedance matching circuit 212 operative to effect impedance matching of the signal received by the antenna 208 to a prescribed input impedance of the amplifier 204 during RF receive mode of an MRI scan. FIG. 4 is an illustrative drawing of an effective RF active detuning mode circuit 400 showing only those RF components of the detuning and impedance matching network 212 operative to effect active detuning during an excitation mode of an MRI scan. FIG. 5 is an illustrative drawing of an effective RF passive detuning mode circuit 500 showing only those RF components of the detuning and impedance matching network 212 operative to effect passive tuning during an excitation mode of an MRI scan.

Referring to FIG. 3, during RF receive mode of an MRI scan, a first reactive impedance element 230 is RF coupled in series with a center conductor 226 of the first transmission line 210, between a first node, labelled node C, at the center conductor 226 at the second end portion 210-2 of the first transmission line 210 and a third node, labelled node D. A second reactive impedance element 232 is RF coupled between the third node, labelled node D, and a second node, labelled node E, at a relative ground conductor 228 of the first transmission line 210 at the second end portion 210-2 of the first transmission line 210. The first reactive impedance element 230 and the second reactive impedance element 232, together with the impedance transformation circuit 215, may be selected to minimize receive signal reflection over the transmission line 210 and to maximize receive signal power transfer over the transmission line 210. An input impedance seen by the amplifier circuit 204 may be prescribed by a user or a manufacturer requirement to minimize receive signal reflections, maximize receive signal power transfer or minimize amplifier noise figure. An example optimal input impedance for the amplifier 204 can be measured between the first node F to the amplifier 204 and the second input node G to the amplifier 204, shown in FIG. 2A. The first and second impedances 230, 232 are included in a first set of reactive impedance elements used to cause matching of overall impedance of the RF receive circuit 202 to a prescribed input impedance seen at the amplifier circuit 204 at a prescribed RF frequency during a receive mode of the MRI scanner 204. The third reactive impedance 240 is not a part of the first set of reactive impedance elements.

More particularly, the reactive impedance elements 222, 230, 232, along with transmission line 210, cooperate to transform the impedance of the antenna 208 such that the impedance presented by the receive circuit 202 between third node, labelled node D, and second node, labelled node E, as further transformed by impedance transformation performed by the impedance transformation circuit 215, is optimal for the amplifier 204. More particularly, the first and second reactive impedances 230, 232 are coupled in an example L-network between the first transmission line 210 and the impedance transformation circuit 215. Impedance values for of the first and second reactive impedance elements 230, 232 in an example L-network are selected to operate with the impedance transformation circuit 215 to present an optimal impedance for the amplifier 204. This combination of reactive impedances 222, 232, 230, transmission line 210, and the impedance transformation circuit 215, allow the antenna 208 to be located at a distance from the amplifier 204 while presenting the optimal input impedance to the amplifier 204.

Thus, during operation of the RF receive mode circuit 300 shown in FIG. 3, the first and second reactive impedance elements 230, 232 behave as impedance matching components. Additionally, these impedance elements also serve as tuning components to the resonant circuit. However, as explained below with reference to FIGS. 4-5, the circuit connections within the impedance matching and detuning circuit 212 are reconfigurable to convert the first and second reactive impedance elements 230, 232 to behave as detuning components during active and/or passive RF detuning. During an MRI scan, the first and second reactive impedance elements 230, 232 alternate between performing dual roles, as RF impedance matching components during receive mode and as RF detuning components during excitation mode.

An example first reactive impedance element 230 and an example second reactive impedance element 232 can include respective single capacitors 231 and 233 as shown. An alternative first series reactive impedance element (not shown) can include a multi-capacitor circuit, an inductor circuit, or circuits containing a combination of capacitors and inductors. Similarly, an alternative second reactive impedance element (not shown) can include a multi-capacitor circuit, an inductor circuit, or circuits containing a combination of capacitors and inductors.

Referring to FIG. 2A, an active detuning circuit includes a first switch 234 comprising a PIN diode 235 that is operable during active detuning to connect the third reactive impedance element 240 to contribute to the detuning function in the RF active detuning circuit and to change circuit connections of the first and second reactive impedances 230, 232 to convert their function from contributing to RF impedance matching to contributing to RF active detuning. The active detuning circuit also includes a third reactive impedance 240 and a blocking inductor 244. The PIN diode has an anode electrically connected to first node, labelled node C, and has a cathode electrically connected to a fourth node, labelled node H. The third reactive impedance 240 has a terminal connected to the node H and a terminal connected to second node, labelled node E, at ground potential. The blocking inductor 244 has a terminal connected to node H and a terminal connected to second node, labelled node E, at ground potential. Thus, the first switch and the third reactive impedance are connected in series with one another and in parallel with the second end portion 210-2 of the first transmission line 210. Moreover, the third reactive impedance 240 and the blocking inductor 244 are connected in parallel with one another between the fourth node, labelled node H, at the cathode of the PIN diode 235, and second node, labelled node E, at ground potential.

The example third reactive impedance element 240 shown in FIGS. 3-5 includes a respective single capacitor 241. Alternative third reactive impedance elements (not shown) can include a multi-capacitor circuit, an inductor circuit, or circuits containing a combination of capacitors and inductors.

During the RF receive mode, a first switch 234 comprising the PIN diode 235 is turned off such that an effective RF active detuning circuit 400 discussed below with reference to FIG. 4 is inoperative. More particularly, referring to FIG. 2A, RF active detuning is inoperative during the receive mode because no DC turn-on voltage is imparted to the PIN diode 235, and as a result, the switch 234 is turned off, causing an RF open circuit to RF currents at a location of the first switch 234 that disconnects the third reactive impedance element 240 from a second connection with the first transmission line 210 during RF receive mode operation. In contrast, as explained more fully below, during active detuning during an excitation mode, a DC turn-on voltage turns on the PIN diode 235 causing the third parallel reactive impedance 240 to become connected in parallel with the second end portion 210-2 of the first transmission line 210.

Figure 2B:
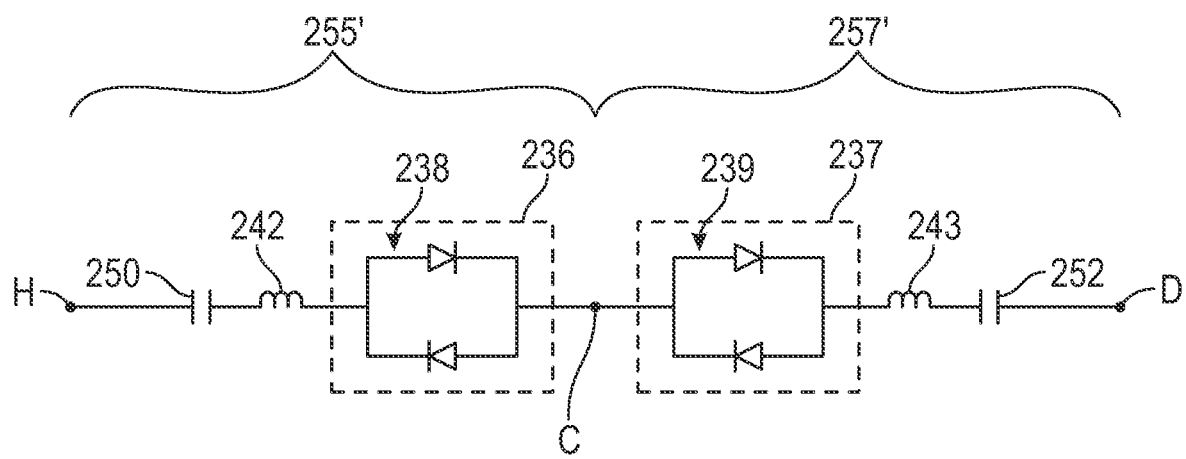
FIG. 2B is an illustrative circuit diagram showing additional details of example second and third switches of the circuit of FIG. 2A.

Referring to FIG. 2B, a passive detuning circuit includes second and third switches 236, 237, that include respective first and second cross-coupled PIN diodes pairs 238, 239, that are operable during passive detuning to connect the third reactive impedance element 240 to contribute to the detuning function in the RF passive detuning circuit and to change circuit connections of the first and second reactive impedances 230, 232 to convert their function from contributing to RF impedance matching to contributing to RF active detuning. The passive detuning circuit also includes first and second passive detuning inductances 242, 243 and first and second blocking capacitors 250, 252. The passive detuning circuit includes a first branch circuit 255' that includes the second switch 236, the first passive inductance 242 and the first blocking capacitance 250 connected in series, with the first passive inductance 242 connected between the second switch 236 and the first blocking capacitor 250. The passive detuning circuit includes a second branch circuit 257' that includes the third switch 237, the second passive inductance 243 and the second blocking capacitance 252 connected in series, with the second passive inductance 243 connected between the third switch 237 and the second blocking capacitor 252. The second switch 236 includes a terminal connected to first node, labelled node C, and a terminal connected to a first terminal of the first passive inductance 242. The third switch 237 includes a terminal connected to first node, labelled node C, and a terminal connected to a first terminal of the second passive inductance 243. The first blocking capacitance 250 includes a terminal connected to the second terminal of the first passive inductance 242 and a terminal connected to fourth node, labelled node H. The second blocking capacitance 252 includes a terminal connected to the second terminal of the second passive inductance 243 and a terminal connected to third node, labelled node D. Thus, the first branch circuit 255 is connected in series with the third reactive impedance element 240 between first node, labelled node C, and second node, labelled node E, at ground potential, and the second branch circuit 257 is connected in series with the second reactive impedance 232 between the first node, labelled node C, and second node, labelled node E, at ground potential. Therefore, the series-connected first branch circuit 255 and third reactive impedance element 240 is connected in parallel with the series-connected second branch circuit 257 and second reactive impedance element 232. Moreover, both the series-connected first branch circuit 255 and third reactive impedance element 240 and the series-connected second branch circuit 257 and second reactive impedance element 232 are coupled in parallel with the second end portion 210-2 of the first transmission line 210.

Still referring to FIG. 2B, during the RF receive mode operation, the second and third switches 236, 237 are turned off such that an RF passive detuning circuit 500 discussed below with reference to FIG. 5 is inoperative. The example RF passive detuning circuit 500 is inoperative during the RF receive mode because the RF receive signal has a voltage level below a threshold turn-on voltage required to turn on the cross-coupled PIN diode pairs 238, 239, which results in the respective second and third switches 236, 237 being turned off during the RF receive mode. Turn-off of the second switch 236, disconnects the first passive detuning inductance 242 and the third reactive impedance element 240 from RF coupling in parallel with the first transmission line 210. Similarly, turn-off of the third switch 237 disconnects the second passive detuning inductance 243 and the second reactive impedance element 232 from RF coupling in parallel with the first transmission line 210. In contrast, as explained more fully below, during RF passive detuning during an RF excitation mode, the RF excitation signal induces an RF voltage level that is great enough to turn on the first and second cross-coupled PIN diode pairs 238, 239 of the respective second and third switches 236, 237. As explained more fully below, turn on of the first cross-coupled PIN diode 238 causes the first passive detuning inductance 242 and the third reactive impedance element 240 to be RF coupled in parallel with the first transmission line 210, and turn on of the second cross-coupled PIN diode 239 causes the second passive detuning inductance 243 and the second reactive impedance element 232 to be RF coupled in parallel with the first transmission line 210.

It will be understood that the RF passive detuning circuit 500 is operational if the RF active detuning circuit 400 fails while the receive circuit 202 resonates at the prescribed frequency while during the excitation mode, which induces a sufficiently high voltage to turn on the first and second cross-coupled PIN diodes pairs 238, 239. However, if the RF active detuning circuit 400 is operative during the transmit excitation mode, then a voltage at the cross-coupled diode pairs 238, 239 will not be sufficient to turn them on. It will be clear to those skilled in the art that it is possible that in some cases only the first cross-coupled PIN diode pair, 236, may have a sufficiently high voltage to turn on, and that the resulting effective circuit would most closely resemble that in FIG. 4.

Referring to FIG. 4, during an RF excitation mode of an MRI scan, the effective RF active detuning circuit 400 includes the first, second, and third reactive impedance elements 230, 232, 240, the antenna reactive impedance element 222 coupled between fifth node, labelled node A, and sixth node, labelled node B, and the first transmission line 210. The RF active detuning circuit 400 includes the first reactive impedance element 230 operatively connected in series with the first transmission line 210 between first node, labelled node C, and third node, labelled node D. The RF active detuning circuit 400 includes the second and third reactive impedance elements 232, 240 operatively connected in parallel at the second end portion 210-2 of the first transmission line between first node, labelled node C, and second node, labelled node E. The RF active detuning circuit 400 includes an antenna reactive impedance element 222 operatively coupled in parallel with the first end portion 210-1 of the first transmission line 210 between fifth node, labelled node A, and sixth node, labelled node B. The RF active detuning circuit 400 is operative to detune sensitivity of the receive circuit 202 by creating a high impedance between fifth node, labelled node A, and sixth node, labelled node B, at the antenna 208 located at first end portion 210-1 of the first transmission line 210 to block current flow on antenna 208. This blocking is accomplished primarily by the third reactive impedance element 240 acting in conjunction with the first transmission line 210 and with the first and second reactive impedance elements 230 and 232. Blocking as used herein is defined as creating a high impedance at the antenna portion 208, so that the antenna is less sensitive to RF signals. The reduced sensitivity of the antenna 208 results in reduced risk of injury to a patient or damage to circuitry due to excitation mode energy. Blocking is achieved by creating a high impedance at the Larmor frequency at the first transmission line portion 210-1 from the antenna 208 as shown in FIG. 4. It is noted that no circuit element is required to be connected between fifth node, labelled node A, and sixth node, labelled node B, in order to create a high impedance between fifth node, labelled node A, and sixth node, labelled node B. The first, second, and third reactive impedance elements 230, 232, and 240 are included in a second set of reactive impedance elements during active detuning and are used to increase impedance at the antenna 208, to reduce sensitivity of the antenna 208 to RF signals at the prescribed frequency during an excitation mode of the MRI scanner 100.

Referring to FIGS. 2A and 4, during the RF excitation mode, the first switch 234 comprising the PIN diode 235 is turned on to activate the RF active detuning circuit 400. An example PIN diode 235 has a first node, labelled node C, electrically connected to inner coaxial signal conductor 226 of the transmission line 210 at first node, labelled node C, and has a cathode connected to fourth node, labelled node H. The third reactive impedance element 240 and a first blocking inductor 244 are connected in parallel between first node 246 and ground potential. During the excitation mode, a DC turn-on signal provided to the third node, labelled node D, via a Vcc voltage source is transmitted via second blocking inductor 248 to the anode of the PIN diode 235 to turn on the PIN diode 235. The PIN diode 235 is selected to have a property such that it behaves as short circuit to an RF signal when forward biased (i.e., turned on) and as an open circuit when reverse biased (i.e., turned off). The first blocking inductor 244 has a value selected such that the first blocking inductor 244 appears to be a wire (e.g., a short circuit) to a DC current and appears to be an RF blocking circuit element (e.g., an open circuit) to a signal at the prescribed RF frequency. A reactance of an example third impedance element 240 is in resonance (or approximate resonance), at the Larmor frequency, with coaxial cable 210 and reactive impedance element 222 connected across fifth node, labelled node A, and sixth node, labelled node B. When PIN diode 235 is turned on and the RF active detuning circuit 400 of FIG. 4 is operating, a DC turn-on current flows through a second blocking inductor 248 connected in parallel with the first reactive impedance elements 230, through the PIN diode 235, though the first blocking inductor 244, to ground. Like the first blocking inductor 244, the second blocking inductor 248 acts as a short circuit for DC signals and as an open circuit to RF signals. These blocking inductors allow the DC current to pass capacitive elements 231 and 241, which are open circuits to DC current. If alternative impedance elements 230 and 240 are used such that there is a DC pathway through these elements (e.g. an inductive element), blocking inductors in parallel with these elements may not be necessary. Also, when the PIN diode 235 is turned on, an RF signal path is created through a series circuit connected in parallel with the transmission line 210 comprising the turned-on PIN diode 235 and the third reactive impedance elements 240.

Also, during operation of the RF active detuning circuit 400, the first blocking capacitor 250, which is operatively connected between the fourth node, labelled node H, and the first cross-coupled PIN diode switch 238, blocks DC current from turning on either diode of the first cross-coupled PIN diode switch 238. Similarly, a second blocking capacitor 252, which is operatively connected between the second cross-coupled PIN diode switch 239 and third node, labelled node D, blocks DC current from turning on either diode of the second cross-coupled PIN diode switch 239.

Referring to FIG. 5, in the absence of a DC turn-on signal during an RF excitation mode of an MRI scan, the RF passive detuning circuit 500 is operative. An excitation signal can momentarily induce an RF signal within the antenna 208 that causes turn-on of the RF passive detuning circuit 500. The first switch 234 may fail to turn on, for any reason that might prevent sufficient DC current from flowing through it. For example, the MRI scanner system 100 might fail to provide a DC-bias to the RF active detuning circuit 400 due to failure to plug-in the receive circuit 202 to a power source or due to a break in the connection to the DC bias input.

More particularly, during an RF excitation mode in the absence of turn-on of the switch 234, an excitation signal is generated across the second and third switches 236, 237 that has a voltage level that is sufficiently high to turn on the cross-coupled PIN diode switches 238, 239. The first and second blocking capacitances 250, 252 have capacitance values selected such that they behave as short circuit elements to an RF signal. Also, as explained above, the first blocking inductor 244 behaves as open circuit element to an RF signal. The first and second passive tuning elements 242, 243 are tunable to tune a frequency characteristics of the passive detuning circuit 500. The tuning inductors 242, 243 can be used for example to compensate for small innate capacitances and inductances of a circuit board (not shown) in which receive circuit 202 are formed. Thus, turn on of the second and third switches 236, 237 activates the passive detuning circuit 500 of FIG. 5.

The example RF passive detuning circuit 500 includes the first, second, and third reactive impedance elements 230, 232, 240, the antenna reactive impedance 222 connected between fifth node, labelled node A, and sixth node, labelled node B, the first transmission line 210, and first and second tuning inductors 242, 243. It should be noted that the tuning inductors, 242,243, may be replaced with other reactive elements, such as capacitors. The first reactive impedance element 230 is operatively connected in series with the transmission line 210 between first node, labelled node C, and third node, labelled node D. A first RF sub-circuit 255' comprising the third reactive impedance element 240 and the first tuning inductor 242, connected in series, is operatively connected between first node, labelled node C, and second node, labelled node E, in parallel with the second end portion 210-2 of the first transmission line 210 and node E. A second RF sub-circuit 257' comprising the second reactive impedance element 232 and the second tuning inductor 243, connected in series, is operatively connected between first node, labelled node C, and second node, labelled node E, in parallel with the second end portion 210-2 of the first transmission line 210. Second tuning inductor 243 is also operatively connected between first node, labelled node C, and third node, labelled node D. The RF passive detuning circuit 500 is operative to detune sensitivity of the receive circuit 202 by creating a high impedance between fifth node, labelled node A, and sixth node, labelled node B, at the antenna 208 located at first end portion 210-1 of the first transmission line 210 to block current flow on antenna 208. This blocking is accomplished primarily by the third reactive impedance element 240 acting in conjunction with the first transmission line 210 and with the first and second reactive impedance elements 230 and 232. Blocking is defined as creating a high resistance at the antenna portion 208, so that the antenna is less sensitive to RF signals. The reduced sensitivity of the antenna 208 results in reduced risk of injury to a patient or damage to circuitry due to excitation mode energy. Blocking is achieved by creating a high resistance at the Larmor frequency at the first transmission line portion 210-1 from the antenna 208 as shown in FIG. 5. It is noted that no circuit element is required to be connected between fifth node, labelled node A, and sixth node, labelled node B, in order to create a high impedance between fifth node, labelled node A, and sixth node, labelled node B. The first, second, and third reactive impedance elements 230, 232, and 240, and inductors 242, 243, are included in a second set of reactive impedance elements during passive detuning and are used to increase of impedance at the antenna 208 to reduce sensitivity of the antenna 208 to RF signals at the prescribed frequency during an excitation mode of the MRI scanner 100.

Referring to FIGS. 2A-2B, there are shown additional details of the first RF sub-circuit 255' and additional details of the second RF sub-circuit 257'. The first sub-circuit 255' includes the first blocking capacitor 250, the first tuning inductor 242, and the first cross-coupled PIN diode switch 236 connected in series between first node, labelled node C, at the first transmission line center conductor 226 and fourth node, labelled node H, at a terminal of the third reactive impedance 240. The second RF sub-circuit 257' includes the second blocking capacitor 252, the second tuning inductor 243, and the second cross-coupled PIN diode switch 237 connected in series between first node, labelled node C, at the first transmission line center conductor 226 and third node, labelled node D, at a terminal of the second reactive impedance 232.

Figure 6A:
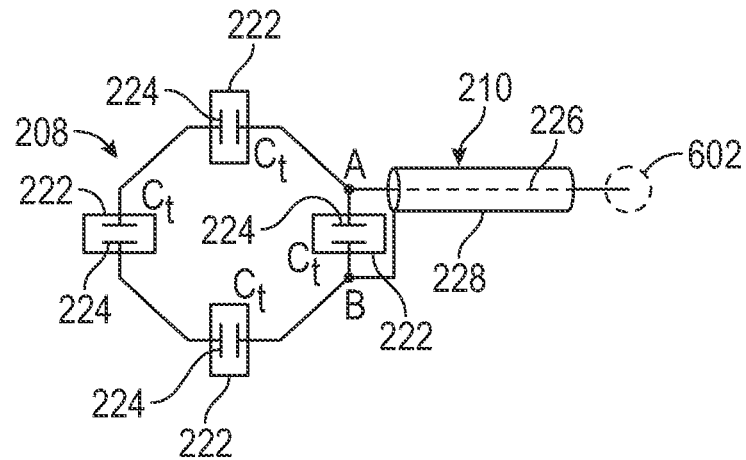
FIG. 6A is an illustrative drawing showing a break in the transmission line of the receive circuit of FIG. 2A.
Figure 6B:
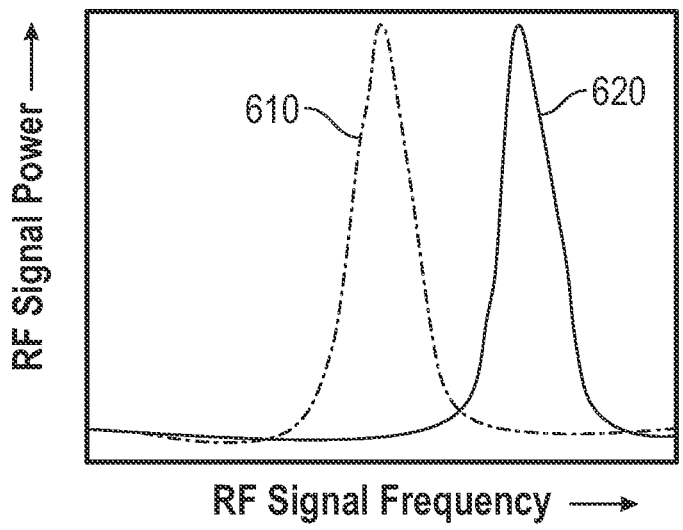
FIG. 6B is an illustrative drawing representing a shift in resonant frequency due to an occurrence of an example break in the transmission line represented in FIG. 6A.
Figure 7:
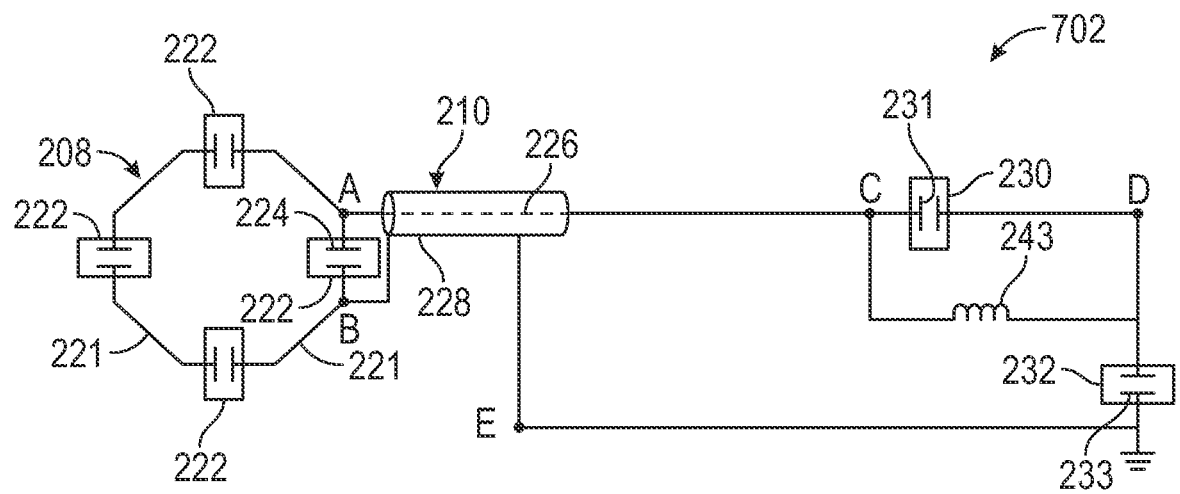
FIG. 7 is an illustrative drawing of an effective RF passive detuning mode circuit that results from failure of the third reactive impedance element of the first receive circuit of FIG. 2A.

FIGS. 6A-6B are illustrative drawings showing a break in the first transmission line 210 (FIG. 6A) and a corresponding resonant frequency shift of the receive circuit 202 (FIG. 6B). A break in the transmission line 210 is a potential failure event for the example receive circuit 202. A location of an example break in the first transmission line 210 is represented by circle 602. When the transmission line 210 is broken at location 602, or at any location along the transmission line 210, a new effective circuit indicated in FIG. 6A is formed. An occurrence of such a break 602 effectively removes the first reactive impedance element 230 and the second reactive impedance element 232 from the RF receive mode circuit 300 of FIG. 3. The removal of these two impedance elements 230, 232 due to a break in the transmission line 210 circuit is results in an effectively higher resonant frequency as shown in FIG. 6B, in which curve 610 represents power versus resonant frequency for no break (i.e., normal operation) and curve 620 represents power versus frequency in the event of an example break 602 in the transmission line 210. In an example receive circuit 202, a break in the transmission line 210 results in a shift to a higher resonant frequency, or a resonance further away from a prescribed frequency such as the Larmor frequency. FIG. 7 is an illustrative drawing of an effective RF passive detuning mode circuit 702 that results from failure of the third reactive impedance element 240 of the first receive circuit 202 of FIG. 2A. For example, referring to FIG. 2A, if the third reactive impedance element 240 fails, then neither the RF active detuning mode circuit 400 nor the RF passive detuning mode circuit 500 would be effective since both rely upon operation of the third reactive impedance element 240. The DC signal will not change despite the break as it still has a DC path through blocking inductor 248. However, the lack of RF active detuning in the circuit results in presence of a high voltage across the cross diodes 238, 239. While the first cross-coupled diode 238 is effectively not helpful with the third reactive impedance element 240 removed, the second cross-coupled diode 239 forms an RF circuit with reactive impedance elements 230, 232, tuning inductor 243 and the transmission line 210, to impart a high impedance at the first end portion 210-1 of the first transmission line 210 to thereby block current in the antenna 208. Referring now to FIG. 7, in the event of failure of the third reactive impedance element 240, the passive detuning circuit 702 will include the first reactive impedance element 230 connected between first node, labelled node C, and third node, labelled node D, the second reactive impedance element 232 connected between third node, labelled node D, and second node, labelled node E, and the tuning inductor 243 connected between first node, labelled node C, and third node, labelled node D. Thus, the tuning inductor 243 connected between first node, labelled node C, and third node, labelled node D, can cause an increase in impedance at the antenna 208 sufficient to block current. More particularly, the RF passive detuning circuit 702 is operative to detune sensitivity of the receive circuit 202 by creating a high impedance between fifth node, labelled node A, and sixth node, labelled node B, at the antenna 208 located at first end portion 210-1 of the first transmission line 210 to block current flow on antenna 208. This blocking is accomplished by the first transmission line 210, the first and second reactive impedance elements 230 and 232, and the tuning inductor 243. Blocking as used herein is defined as creating a high resistance at the antenna portion 208, so that the antenna is less sensitive to RF signals. The reduced sensitivity of the antenna 208 results in reduced risk of injury to a patient or damage to circuitry due to excitation mode energy. Blocking is achieved by creating a high resistance at the Larmor frequency at the first transmission line portion 210-1 from the antenna 208 as shown in FIG. 7. It is noted that no circuit element is required to be connected between fifth node, labelled node A, and sixth node, labelled node B, to create a high impedance between fifth node, labelled node A, and sixth node, labelled node B.

Figure 8:
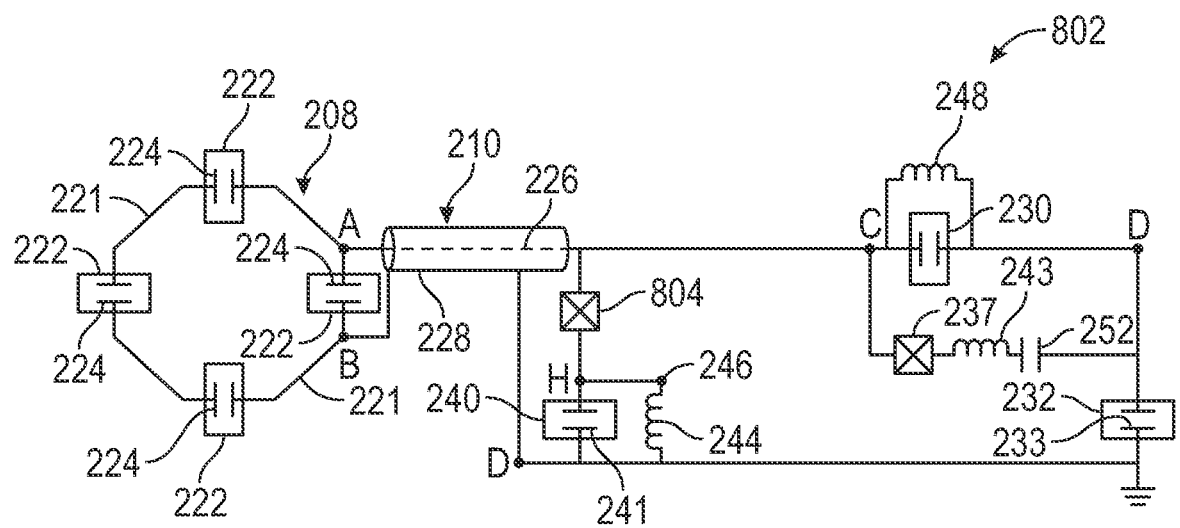
FIG. 8 is an illustrative circuit diagram showing a second example receive circuit in accordance with some embodiments.

FIG. 8 is an illustrative circuit diagram showing a second example receive circuit 802 in accordance with some embodiments. For economy of disclosure, only portions of the second example receive circuit 802 are described that are different from the first receive circuit 202. Moreover, to simplify the disclosure, neither the impedance transformation circuit 215 nor the amplifier 204 are shown. However, it will be understood that the second receive circuit 203 can be connected to impedance transformation circuit 215 and the amplifier 204 as explained above. The active detuning circuitry of the second receive circuit 802 shown in FIG. 8 includes a first cross-coupled PIN diode switch 804 instead of the PIN diode switch 234 shown in FIG. 2A. Additionally, the passive detuning circuitry of the second receive circuit 802 omits the first branch circuit 255 shown in FIG. 2A and includes the cross-coupled PIN diode switch 804 and the third cross-coupled PIN diode switch 237. During receive mode, both switches 804 and 237 are turned off and RF behavior of the second receive circuit 802 is as explained with reference to FIG. 3. During RF active detuning operation, a DC voltage turns on the switch 804 but not switch 237 since the blocking capacitor 252 blocks DC current, and the RF behavior of the second receive circuit 802 is as explained with reference to FIG. 4. During RF passive detuning operation, an excitation signal causes turn-on of the switch 804 and switch 237 since blocking inductor 244 is selected to act as an open circuit for RF and capacitor 252 is selected to act as short circuit for RF.

Figure 9:
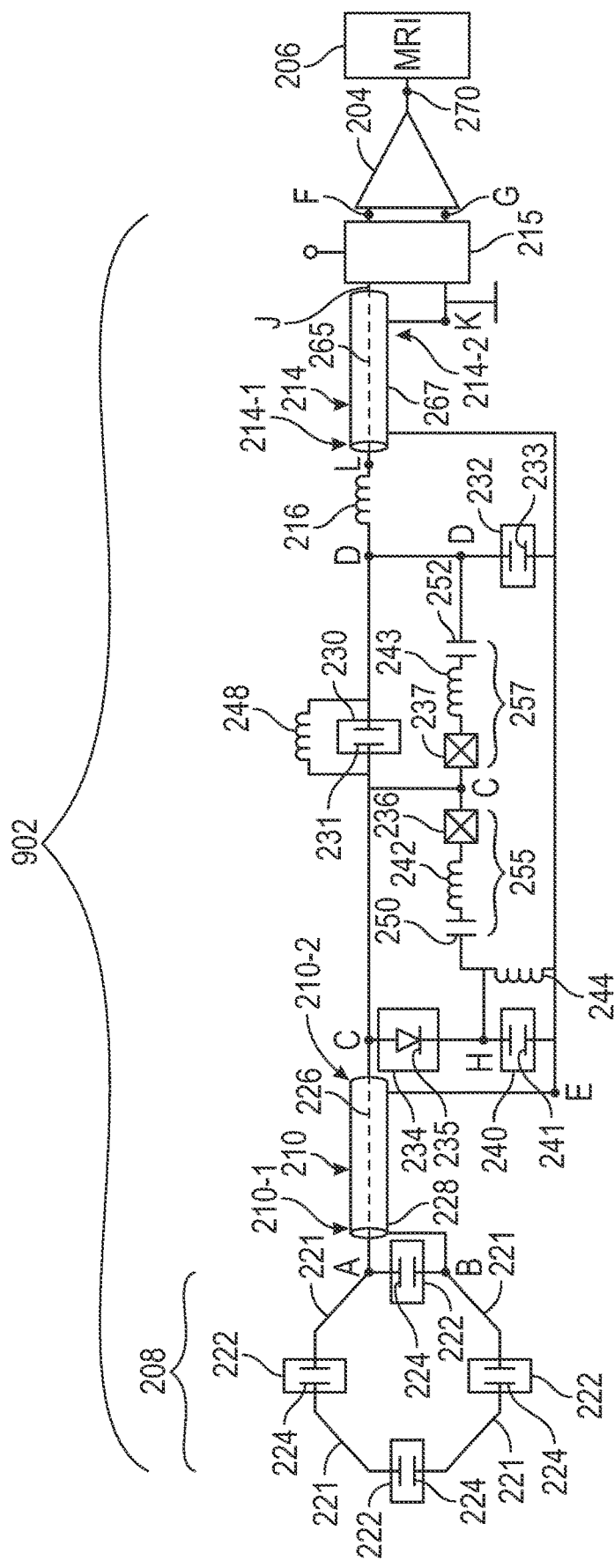
FIG. 9 is an illustrative circuit diagram showing a third example receive circuit in accordance with some embodiments.

FIG. 9 is an illustrative circuit diagram showing a third example receive circuit 902 in accordance with some embodiments. For economy of disclosure, only portions of the second example receive circuit 902 are described that are different from the first receive circuit 202. The third receive circuit 902 is identical to the first receive circuit 202 except that an inductor 216 and a second transmission line 214 are electrically connected between the impedance matching and detuning circuit 212. The inductor 216, which is a reactive impedance element, has a terminal coupled to a third node, labelled node D, between a first reactive impedance element 230 and a second reactive impedance element 232 and has a terminal connected to a fourth node, labelled node L, at a center conductor 265 at a first end portion 214-1 of the second transmission line 214. Inductor 216 is provided to optimize impedance transformation through the second transmission line 214. A small variable impedance allows adjustment of impedance transformation. A relative ground conductor 267 of the second transmission line is coupled to the second node, labelled node E, at relative ground potential. An example impedance transformation circuit 215 is connected in parallel with a second end portion 214-2 of the second transmission line 214. More specifically, respective first and second input terminals of the impedance transformation circuit 215 are coupled across the signal and relative ground conductors 265, 267 at a second end portion 214-2 of the second transmission line 214 respectively at nodes J and K. Respective first and second output terminals of the impedance transformation circuit 215 are coupled to respective first and second input terminals of the amplifier circuit 204 at respective nodes F and G. The second transmission line 214 permits the amplifier circuit 204 to be located physically separate from the second end portion 210-2 of the first transmission line 210 and from the impedance matching and detuning circuit 212.

Figure 10A:
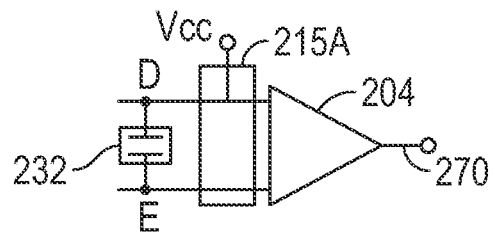
FIGS. 10A-10F show an illustrative drawings of example first through sixth impedance transformation circuits.
Figure 10B:
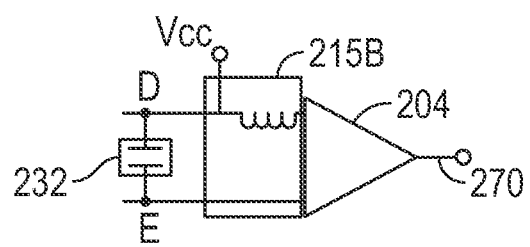
Figure 10C:
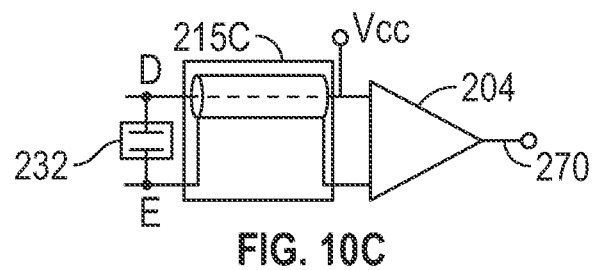
Figure 10D:
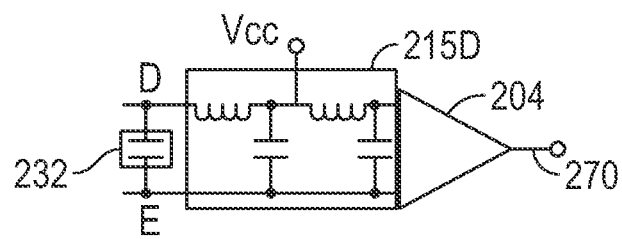
Figure 10E:
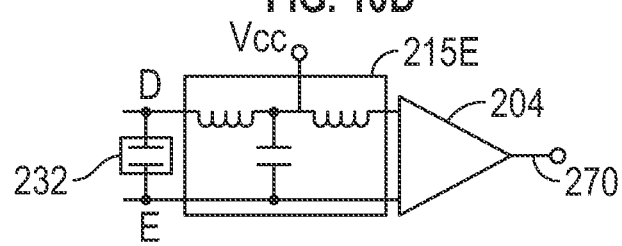
Figure 10F:
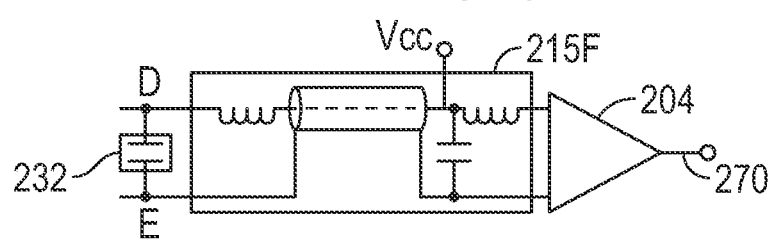

FIGS. 10A-10F are illustrative example circuits showing illustrative example impedance transformation circuits 215A-215F connected across inputs to an example amplifier 204. More particularly, FIGS. 10A-10F show different example impedance transformation circuits 215A-215F that can be coupled across the third node, labeled node D, and the fourth node, labelled node H, in parallel with the second reactive impedance 232, between the second impedance 232 and inputs to an amplifier circuit 204. Moreover, example circuits 215A-215F show coupling to a DC voltage source Vcc that can activated during excitation mode operation of an MRI scanner 100. FIG. 10A shows an illustrative drawing of a first impedance transformation circuit 215A that includes only signal conductor lines between the second reactive impedance 232 and input to the amplifier circuit 204. FIG. 10B shows an illustrative drawing of a second impedance transformation circuit 215B that includes a single inductor connected between the third node labeled node D and an input to amplifier 204. FIG. 10C shows an illustrative drawing of a third impedance transformation circuit 215C that includes a transmission line segment across third node, labeled node D, and the fourth node, labelled node H, between the reactive impedance element 232 and inputs of amplifier 204. FIG. 10D shows an illustrative drawing of a fourth impedance transformation circuit 215D that includes a first ladder network that includes two capacitors coupled across inputs to an amplifier 204 and two inductors coupled in series connected between the third node labeled node D and an input to amplifier 204. FIG. 10E shows an illustrative drawing of a fifth impedance transformation circuit 215E that includes a second ladder network with two inductors coupled in series connected between the third node labeled node D and an input to amplifier 204 and with one capacitor coupled across inputs to an amplifier 204 between the series-connected inductors. FIG. 10F shows an illustrative drawing of a sixth impedance transformation circuit 215F that a first inductor connected between the third node labeled node D and a signal conductor at a first end portion of a transmission line and second inductor connected between the signal conductor at a second end portion of the transmission line and an input to the amplifier and a capacitor coupled across inputs to the amplifier 204 between the second end portion of the transmission line and the second inductor. The example impedance transformation circuits 215A-215F are merely illustrative and exact circuit configurations can depend upon specific physical and electrical implementation of the receive circuit 202 and characteristics of amplifier 204. Moreover, it will be appreciated that the first and second reactive impedance elements 230, 232 are electrically connected to each of example circuits 215A-215F to contribute to impedance transformations achieved using those circuits.

VARIOUS EXAMPLES

Examples of the resonant trap can include:

Example 1 includes a radio frequency (RF) circuit for use with a magnetic resonance imaging (MRI) scanner to transmit an RF receive signal to an amplifier circuit, the RF circuit comprising: a transmission line including a first end portion and a second end portion; an antenna electrically connected in parallel with the transmission line at the first end portion of the transmission line; an impedance transformation circuit; an impedance matching and detuning circuit electrically connected between the transmission line and the impedance transformation circuit, in parallel with the transmission line at the second end portion of the transmission line, and in parallel with the impedance transformation circuit, wherein the impedance matching and detuning circuit includes: multiple reactive impedance elements; and two or more switches operable to controllably switch between configuring RF connections between the multiple reactive impedance elements to, RF connect a first set of the multiple reactive impedance elements to the second end portion of the transmission line to cause matching of overall impedance of the RF circuit to a prescribed input impedance seen at the amplifier circuit at a prescribed RF frequency during a receive mode of the MRI scanner, and RF connect a second set of the multiple reactive impedance elements to the second end portion of the transmission line to cause an increase of impedance at the antenna, to reduce sensitivity of the antenna to RF signals at the prescribed frequency during an excitation mode of the MRI scanner.

Example 2 can include the subject matter of Example 1, wherein the two or more switches include: an active switch controllable based upon a DC control signal to switch between, a first active switch configuration in which the active switch RF disconnects at least one of the multiple reactive impedance elements from the second end portion of the transmission line to configure the first set of reactive impedance elements contribute to matching overall impedance of the RF circuit to the prescribed input impedance seen at the amplifier circuit at a prescribed RF frequency during a receive mode of the MRI scanner, and a second active switch configuration in which first switch RF connects the at least one of the multiple reactive impedance elements to the second end portion of the transmission line to configure the second set of reactive impedance elements to increase impedance at the antenna, to reduce sensitivity of the antenna to RF signals during an excitation mode of the MRI scanner; and a passive switch controllable based upon a voltage level of the RF receive signal transmitted within the RF circuit between, a first passive switch configuration in which the second switch RF disconnects at least one of the multiple reactive impedance elements from the second end portion of the transmission line in absence of an RF signal transmitted within the RF receive circuit having a voltage at or above a threshold voltage to configure the first set of reactive impedance elements to contribute to matching overall impedance of the RF circuit to a prescribed input impedance seen at the amplifier circuit at a prescribed RF frequency during a receive mode of the MRI scanner, and a second passive switch configuration in which the second switch RF connects at least one of the multiple reactive impedance elements to the second end portion of the transmission line in response to an occurrence of an RF signal transmitted within the RF receive circuit having a voltage at or above the prescribed threshold voltage to configure the second set of reactive impedance elements to increase impedance at the antenna, to reduce sensitivity of the antenna to RF signals during an excitation mode of the MRI scanner.

Example 3 can include the subject matter of Example 1, wherein the multiple reactive impedance elements include: a first reactive impedance element; a second reactive impedance element; and a third reactive impedance element; wherein the first set includes the first reactive impedance element and the second reactive impedance element; and wherein the first set includes the first reactive impedance element, the second reactive impedance element, and the third reactive impedance element.

Example 4 can include the subject matter of Example 3, wherein the two or more switches operable to RF connect the first reactive impedance element and the second reactive impedance element in an L-configuration with the first reactive impedance element RF connected in series with the transmission line at the second end portion of the transmission line and the second reactive impedance element RF connected in parallel with the transmission line at the second end portion of the transmission line after the first reactive impedance element, to cause matching of overall impedance of the RF circuit to a prescribed input impedance seen at the amplifier circuit at a prescribed RF frequency during a receive mode of the MRI scanner; and wherein the two or more switches operable to RF connect the third reactive impedance element RF connected in parallel with the transmission line at the second end portion of the transmission line, to cause an increase of impedance at the antenna, to reduce sensitivity of the antenna to RF signals at the prescribed frequency during an excitation mode of the MRI scanner.

Example 5 can include the subject matter of Example 3, wherein the first reactive impedance element and the second reactive impedance element are operable to be RF connected to contribute to matching overall impedance of the RF circuit to a prescribed input impedance seen at the amplifier circuit at a prescribed RF frequency during the receive mode of the MRI scanner; and wherein the two or more switches include, at least one active switch controllable based upon a DC signal to RF connect the third reactive impedance to the second end portion of the transmission line in response to an occurrence of the DC signal, to increase impedance at the antenna, to reduce sensitivity of the antenna to RF signals during the excitation mode of the MRI scanner; and at least one passive switch controllable based upon a voltage level of an RF signal transmitted within the RF receive circuit to RF connect the third reactive impedance to the second end portion of the transmission line in response to an occurrence of an RF signal within the RF receive circuit having a voltage at or above a threshold voltage, to increase impedance at the antenna, from the matching of overall impedance, to reduce sensitivity of the antenna to RF signals during the excitation mode of the MRI scanner.

Example 6 can include the subject matter of Example 5 further including: a fourth RF impedance element; wherein the at least one passive switch includes a first passive switch controllable based upon the voltage level of an RF signal transmitted within the RF receive circuit to RF connect the third reactive impedance in series with the fourth reactive impedance and in parallel with the second end portion of the transmission line in response to an occurrence of an RF signal within the RF receive circuit having a voltage at or above the threshold voltage, to cause an increase of impedance at the antenna, to reduce sensitivity of the antenna to RF signals.

Example 7 can include the subject matter of Example 6, further including: a fifth RF impedance element; wherein the at least one passive switch includes a second passive switch controllable based upon the voltage level of an RF signal transmitted within the RF receive circuit to RF connect the fifth reactive impedance in parallel with the second end portion of the transmission line and in series with the second reactive impedance, in response to an occurrence of an RF signal within the RF receive circuit having a voltage at or above the threshold voltage, to cause an increase of impedance at the antenna, to reduce sensitivity of the antenna to RF signals.

Example 8 can include the subject matter of Example 7, wherein the first passive switch and the second passive switch are operable switch independently of one another in response to an occurrence of an RF signal within the RF receive circuit having a voltage at or above the threshold voltage.

Example 9 can include the subject matter of Example 7, wherein the first passive switch and the second passive switch are operable switch independently of one another in response to an occurrence of an RF signal within the RF receive circuit having a voltage at or above the threshold voltage; and wherein fourth reactive impedance is operable to cause an increase of impedance at the antenna, from the matching of overall impedance, to reduce sensitivity of the antenna to RF, in an event of a failure of the third reactive impedance.

Example 10 can include the subject matter of Example 1, wherein the RF receive circuit is resonant at the prescribed RF frequency having a prescribed frequency band and a prescribed center frequency, when the two or more switches RF connect the first set of the multiple reactive impedance elements to the second end portion of the transmission line; and wherein a failure of the circuit, that causes electrical disconnection of one or more of the impedance matching and detuning circuit elements or of the entire impedance matching and detuning circuit from the transmission line connecting the circuit to the antenna, causes a shift in resonant frequency of the RF receive circuit to a shifted resonant frequency, having a shifted frequency band and a shifted center frequency different from the respective prescribed frequency band and the prescribed center frequency.

Example 11 can include the subject matter of Example 1, wherein the transmission line is a differential transmission line that includes a signal conductor and a relative ground conductor; wherein the antenna is electrically connected across the signal conductor and the relative ground conductor at the first end portion of the transmission line; and wherein the increase of impedance at the antenna to, from the matching of overall impedance, reduce sensitivity of the antenna to RF signals occurs at a location of the RF circuit where antenna is electrically connected across the signal conductor and the relative ground conductor at the first end portion of the transmission line.

Example 12 can include the subject matter of Example 1, wherein the impedance transformation circuit is configured to transform an input impedance of the amplifier at the antenna to a higher impedance at the antenna during transmission of an RF receive signal within the RF circuit, to minimize current in the antenna to prevent the antenna from producing parasitic RF signal coupling at one or more other antennas.

Example 13 can include the subject matter of Example 1, wherein the prescribed frequency is a Larmor frequency.

Example 14 can include the subject matter of Example 2, wherein the predetermined voltage threshold is an MRI RF excitation signal voltage level.

Example 15 can include the subject matter of Example 3, wherein the two or more switches include an active switch and a first passive switch; wherein the active switch includes a PIN diode electrically connected in series with the third reactive impedance element; wherein the series-connected PIN diode and third reactive impedance are electrically connected in parallel with the second end portion of the transmission line, between a first node at a signal conductor of the transmission line and a second node at a relative ground of the transmission line; and wherein the first passive switch includes a first cross-coupled PIN diode pair electrically connected between the first node and a third node; wherein the first reactive impedance is electrically connected between the first node and the third node; and wherein the second reactive impedance is electrically connected between the third node and the second node.

Example 16 can include the subject matter of Example 15 further including: a first blocking capacitor electrically connected in series between the first passive switch and the third node; wherein the first blocking capacitor behaves as a short circuit to RF signals.

Example 17 can include the subject matter of Example 16, further including: a first reactive tuning element electrically connected in series between the first passive switch and the first blocking capacitor.

Example 18 can include the subject matter of Example 15, further including: a first blocking inductor electrically connected in parallel with the first reactive impedance; wherein the first blocking inductor behaves as an open circuit to RF signals.

Example 19 can include the subject matter of Example 15, further including: wherein the two or more switches include a second passive switch; wherein the second passive switch includes a second cross-coupled PIN diode pair electrically connected between the first node and a fourth node; wherein the third reactive impedance is electrically connected between the fourth node and the third node.

Example 20 can include the subject matter of Example 19, further including: a first blocking capacitor electrically connected in series between the first passive switch and the third node; and a second blocking capacitor electrically connected in series between the second passive switch and the fourth node; wherein each of the first blocking capacitor and the second blocking capacitor behaves as a short circuit to RF signals.

Example 21 can include the subject matter of Example 20, further including: a first reactive tuning element electrically coupled in series between the first passive switch and the first blocking capacitor; and a second reactive tuning element electrically coupled in series between the second passive switch and the second blocking capacitor.

Example 22 can include the subject matter of Example 21, further including: a first blocking inductor electrically connected in parallel with the first reactive impedance; and a second blocking inductor electrically connected in parallel with the third reactive impedance: wherein each of the first blocking inductor and the second blocking inductor behaves as an open circuit to RF signals.

Example 23 can include the subject matter of Example 1, further including: a reactive element electrically connected in parallel with the first end portion of the transmission line, between a fifth node at the signal conductor of the transmission line and a sixth node at a relative ground of the transmission line.

Example 24 can include a radio frequency (RF) circuit for use with a magnetic resonance imaging (MRI) scanner to transmit an RF receive signal to an amplifier circuit, the RF circuit comprising: a transmission line including a first end portion and a second end portion; an antenna electrically connected in parallel with the transmission line at the first end portion of the transmission line; an impedance transformation circuit; an impedance matching and detuning circuit electrically connected between the transmission line and the impedance transformation circuit, in parallel with the transmission line at the second end portion of the transmission line, and in parallel with the impedance transformation circuit, wherein the impedance matching and detuning circuit includes: a first reactive impedance element; a second reactive impedance element; and a third reactive impedance element; an active switch includes a PIN diode electrically connected in series with the third reactive impedance element; a first passive switch that includes a first cross-coupled PIN diode pair electrically connected between the first node and a third node; wherein the series-connected PIN diode and third reactive impedance are electrically connected in parallel with the second end portion of the transmission line, between a first node at a signal conductor of the transmission line and a second node at a relative ground of the transmission line; wherein the first reactive impedance is electrically connected between the first node and the third node; and wherein the second reactive impedance is electrically connected between the third node and the second node.

Example 25 can include the subject matter of Example 24, further including: a first blocking capacitor electrically connected in series between the first passive switch and the third node; wherein the first blocking capacitor behaves as a short circuit to RF signals.

Example 26 can include the subject matter of Example 25, further including: a first tuning inductor electrically connected in series between the first passive switch and the first blocking capacitor.

Example 27 can include the subject matter of Example 24, further including: a first blocking inductor electrically connected in parallel with the first reactive impedance; wherein the first blocking inductor behaves as an open circuit to RF signals.

Example 28 can include the subject matter of Example 24, further including: wherein the two or more switches include a second passive switch; wherein the second passive switch includes a second cross-coupled PIN diode pair electrically connected between the first node and a fourth node; wherein the third reactive impedance is electrically connected between the fourth node and the third node.

Example 29 can include the subject matter of Example 28, further including: a first blocking capacitor electrically connected in series between the first passive switch and the third node; and a second blocking capacitor electrically connected in series between the second passive switch and the fourth node; wherein each of the first blocking capacitor and the second blocking capacitor behaves as a short circuit to RF signals.

Example 30 can include the subject matter of Example 29, further including: a first tuning inductor electrically coupled in series between the first passive switch and the first blocking capacitor; and a second tuning inductor electrically coupled in series between the second passive switch and the second blocking capacitor.

Example 31 can include the subject matter of Example 30, further including: a first blocking inductor electrically connected in parallel with the first reactive impedance; and a second blocking inductor electrically connected in parallel with the third reactive impedance; wherein each of the first blocking inductor and the second blocking inductor behaves as an open circuit to RF signals.

Example 32 can include the subject matter of Example 24, further including: a reactive element electrically connected in parallel with the first end portion of the transmission line, between a fifth node at the signal conductor of the transmission line and a sixth node at a relative ground of the transmission line.

The above description is presented to enable any person skilled in the art to create and use an MRI RF receive circuit. Various modifications to the examples will be readily apparent to those skilled in the art, and the generic principles defined herein may be applied to other examples and applications without departing from the spirit and scope of the invention. In the preceding description, numerous details are set forth for the purpose of explanation. However, one of ordinary skill in the art will realize that the examples in the disclosure might be practiced without the use of these specific details. In other instances, well-known processes are shown in block diagram form in order not to obscure the description of the invention with unnecessary detail. Identical reference numerals are used in some places to represent different views of the same or similar items in different drawings. Thus, the foregoing description and drawings of embodiments and examples are merely illustrative of the principles of the invention. Therefore, it will be understood that various modifications can be made to the embodiments by those skilled in the art without departing from the spirit and scope of the invention, which is defined in the appended claims.

The invention claimed is:

1. A radio frequency (RF) circuit for use with a magnetic resonance imaging (MRI) scanner to transmit an RF receive signal to an amplifier circuit, the RF circuit comprising:
a transmission line including a first end portion and a second end portion;
an antenna electrically connected in parallel with the transmission line at the first end portion of the transmission line;
an impedance transformation circuit;
an impedance matching and detuning circuit electrically connected between the transmission line and the impedance transformation circuit, in parallel with the transmission line at the second end portion of the transmission line, and in parallel with the impedance transformation circuit,
wherein the impedance matching and detuning circuit includes:
multiple reactive impedance elements; and
two or more switches operable to controllably switch between configuring RF connections between the multiple reactive impedance elements to,
RF connect a first set of the multiple reactive impedance elements to the second end portion of the transmission line to cause matching of overall impedance of the RF circuit to a prescribed input impedance seen at the amplifier circuit at a prescribed RF frequency during a receive mode of the MRI scanner, and
RF connect a second set of the multiple reactive impedance elements to the second end portion of the transmission line to cause an increase of impedance at the antenna, to reduce sensitivity of the antenna to RF signals at the prescribed frequency during an excitation mode of the MRI scanner.

2. The RF circuit of claim 1, wherein the two or more switches include:
an active switch controllable based upon a DC control signal to switch between,
a first active Switch configuration in which the active switch RF disconnects at least one of the multiple reactive impedance elements from the second end portion of the transmission line to configure the first set of reactive impedance elements contribute to matching overall impedance of the RF circuit to the prescribed input impedance seen at the amplifier circuit at a prescribed RF frequency during a receive mode of the MRI scanner, and
a second active switch configuration in which first switch RF connects the at least one of the multiple reactive impedance elements to the second end portion of the transmission line to configure the second set of reactive impedance elements to increase impedance at the antenna, to reduce sensitivity of the antenna to RF signals during an excitation mode of the MRI scanner; and a passive switch controllable based upon a voltage level of the RF receive signal transmitted within the RF circuit between, a first passive switch configuration in which the second switch RF disconnects at least one of the multiple reactive impedance elements from the second end portion of the transmission line in absence of an RF signal transmitted within the RF receive circuit having a voltage at or above a threshold voltage to configure the first set of reactive impedance elements to contribute to matching overall impedance of the RF circuit to a prescribed input impedance seen at the amplifier circuit at a prescribed RF frequency during a receive mode of the MRI scanner, and a second passive switch configuration in which the second switch RF connects at least one of the multiple reactive impedance elements to the second end portion of the transmission line in response to an occurrence of an RF signal transmitted within the RF receive circuit having a voltage at or above the prescribed threshold voltage to configure the second set of reactive impedance elements to increase impedance at the antenna, to reduce sensitivity of the antenna to RF signals during an excitation mode of the MRI scanner.

3. The RF circuit of claim 1 wherein the multiple reactive impedance elements include:
a first reactive impedance element;
a second reactive impedance element; and
a third reactive impedance element;
wherein the first set includes the first reactive impedance element and the second reactive impedance element; and
wherein the first set includes the first reactive impedance element, the second reactive impedance element, and the third reactive impedance element.

4. The RF circuit of claim 3,
wherein the two or more switches operable to RF connect the first reactive impedance element and the second reactive impedance element in an L-configuration with the first reactive impedance element RF connected in series with the transmission line at the second end portion of the transmission line and the second reactive impedance element RF connected in parallel with the transmission line at the second end portion of the transmission line after the first reactive element, to cause matching of overall impedance of the RF circuit to a prescribed input impedance seen at the amplifier circuit at a prescribed RF frequency during a receive mode of the MRI scanner; and
wherein the two or more switches operable to RF connect the third reactive impedance element RF connected in parallel with the transmission line at the second end portion of the transmission line, cause an increase of impedance at the antenna, from the matching of overall impedance, to reduce sensitivity of the antenna to RF signals at the prescribed frequency during an excitation mode of the MRI scanner.

5. The RF circuit of claim 3,
wherein the first reactive impedance element and the second reactive impedance element are operable to be RF connected to contribute to matching overall impedance of the RF circuit to a prescribed input impedance seen at the amplifier circuit at a prescribed RF frequency during the receive mode of the MRI scanner; and wherein the two or more switches include,
at least one active switch controllable based upon a DC signal to RF connect the third reactive impedance to the second end portion of the transmission line in response to an occurrence of the DC signal, to increase impedance at the antenna, from the matching of overall impedance, to reduce sensitivity of the antenna to RF signals during the excitation mode of the MRI scanner; and
at least one passive switch controllable based upon a voltage level of an RF signal transmitted within the RF receive circuit to RF connect the third reactive impedance to the second end portion of the transmission line in response to an occurrence of an RF signal within the RF receive circuit having a voltage at or above a threshold voltage, to increase impedance at the antenna, to reduce sensitivity of the antenna to RF signals during the excitation mode of the MRI scanner.

6. The RF circuit of claim 5 further including:
a fourth RF impedance element;
wherein the at least one passive switch includes a first passive switch controllable based upon the voltage level of an RF signal transmitted within the RF receive circuit to RF connect the third reactive impedance in series with the fourth reactive impedance and in parallel with the second end portion of the transmission line in response to an occurrence of an RF signal within the RF receive circuit having a voltage at or above the threshold voltage, to cause an increase of impedance at the antenna, to reduce sensitivity of the antenna to RF signals.

7. The RF circuit of claim 6 further including:
a fifth RF impedance element;
wherein the at least one passive switch includes a second passive switch controllable based upon the voltage level of an RF signal transmitted within the RF receive circuit to RF connect the fifth reactive impedance in parallel with the second end portion of the transmission line and in series with the second reactive impedance, in response to an occurrence of an RF signal within the RF receive circuit having a voltage at or above the threshold voltage, to cause an increase of impedance at the antenna, to reduce sensitivity of the antenna to RF signals.

8. The circuit of claim 7,
wherein the first passive switch and the second passive switch are operable switch independently of one another in response to an occurrence of an RF signal within the RF receive circuit having a voltage at or above the threshold voltage.

9. The circuit of claim 7,
wherein the first passive switch and the second passive switch are operable switch independently of one another in response to an occurrence of an RF signal within the RF receive circuit having a voltage at or above the threshold voltage; and
wherein fourth reactive impedance is operable to cause an increase of impedance at the antenna, from the matching of overall impedance, to reduce sensitivity of the antenna to RF, in an event of a failure of the third reactive impedance.

10. The RF circuit of claim 1,
wherein the RF receive circuit is resonant at the prescribed RF frequency having a prescribed frequency band and a prescribed center frequency, when the two or more switches RF connect the first set of the multiple reactive impedance elements to the second end portion of the transmission line; and
wherein a failure of the circuit, that causes electrical disconnection of one or more of the impedance matching and detuning circuit elements or of the entire impedance matching and detuning circuit from the transmission line connecting the circuit to the antenna, causes a shift in resonant frequency of the RF receive circuit to a shifted resonant frequency, having a shifted frequency band and a shifted center frequency different from the respective prescribed frequency band and the prescribed center frequency.

11. The RF circuit of claim 1,
wherein the transmission line is a differential transmission line that includes a signal conductor and a relative ground conductor;
wherein the antenna is electrically connected across the signal conductor and the relative ground conductor at the first end portion of the transmission line; and
wherein the increase of impedance at the antenna to, from the matching of overall impedance, reduce sensitivity of the antenna to RF signals occurs at a location of the RF circuit where antenna is electrically connected across the signal conductor and the relative ground conductor at the first end portion of the transmission line.

12. The RF circuit of claim 1,
Wherein the impedance transformation circuit is configured to transform an input impedance of the amplifier at the antenna to a higher impedance at the antenna during transmission of an RF receive signal within the RF circuit, to minimize current in the antenna to prevent the antenna from producing parasitic RF signal coupling at one or more other antennas.

13. The RF circuit of claim 1,
wherein the prescribed frequency is a Larmor frequency.

14. The RF circuit of claim 2,
wherein the predetermined voltage threshold is an MRI RF excitation signal voltage level.

15. The RF circuit of claim 3,
wherein the two or more switches include an active switch and a first passive switch;
wherein the active switch includes a PIN diode electrically connected in series with the third reactive impedance element;
wherein the series-connected PIN diode and third reactive impedance are electrically connected in parallel with the second end portion of the transmission line, between a first node at a signal conductor of the transmission line and a second node at a relative ground of the transmission line; and
wherein the first passive switch includes a first cross-coupled PIN diode pair electrically connected between the first node and a third node;
wherein the first reactive impedance is electrically connected between the first node and the third node; and
wherein the second reactive impedance is electrically connected between the third node and the second node.

16. The RF circuit of claim 15 further including:
a first blocking capacitor electrically connected in series between the first passive switch and the third node;
wherein the first blocking capacitor behaves as a short circuit to RF signals.

17. The RF circuit of claim 16 further including:
a first reactive tuning element electrically connected in series between the first passive switch and the first blocking capacitor.

18. The RF circuit of claim 15 further including:
a first blocking inductor electrically connected in parallel with the first reactive impedance;
wherein the first blocking inductor behaves as an open circuit to RF signals.

19. The RF circuit of claim 15 further including:
wherein the two or more switches include a second passive switch;
wherein the second passive switch includes a second cross-coupled PIN diode pair electrically connected between the first node and a fourth node;
wherein the third reactive impedance is electrically connected between the fourth node and the third node.

20. The RF circuit of claim 19 further including:
a first blocking capacitor electrically connected in series between the first passive switch and the third node; and
a second blocking capacitor electrically connected in series between the second passive switch and the fourth node;
wherein each of the first blocking capacitor and the second blocking capacitor behaves as a short circuit to RF signals.

21. The RF circuit of claim 20 further including:
a first reactive tuning element electrically coupled in series between the first passive switch and the first blocking capacitor; and
a second reactive tuning element electrically coupled in series between the second passive switch and the second blocking capacitor.

22. The RF circuit of claim 21 further including:
a first blocking inductor electrically connected in parallel with the first reactive impedance; and
a second blocking inductor electrically connected in parallel with the third reactive impedance;
wherein each of the first blocking inductor and the second blocking inductor behaves as an open circuit to RF signals.

23. The RF circuit of claim 1 further including:
a reactive element electrically connected in parallel with the first end portion of the transmission line, between a fifth node at the signal conductor of the transmission line and a sixth node at a relative ground of the transmission line.

24. A radio frequency (RF) circuit for use with a magnetic resonance imaging (MRI) scanner to transmit an RF receive signal to an amplifier circuit, the RF circuit comprising:
a transmission line including a first end portion and a second end portion;
an antenna electrically connected in parallel with the transmission line at the first end portion of the transmission line;
an impedance transformation circuit;
an impedance matching and detuning circuit electrically connected between the transmission line and the impedance transformation circuit, in parallel with the transmission line at the second end portion of the transmission line, and in parallel with the impedance transformation circuit, wherein the impedance matching and detuning circuit includes:
  a first reactive impedance element;
  a second reactive impedance element; and
  a third reactive impedance element;
  an active switch includes a PIN diode electrically connected in series with the third reactive impedance element;
  a first passive switch that includes a first cross-coupled PIN diode pair electrically connected between the first node and a third node;
  wherein the series-connected PIN diode and third reactive impedance are electrically connected in parallel with the second end portion of the transmission line, between a first node at a signal conductor of the transmission line and a second node at a relative ground of the transmission line;
  wherein the first reactive impedance is electrically connected between the first node and the third node; and
  wherein the second reactive impedance is electrically connected between the third node and the second node.

25. The RF circuit of claim 24 further including:
a first blocking capacitor electrically connected in series between the first passive switch and the third node;
wherein the first blocking capacitor behaves as a short circuit to RF signals.

26. The RF circuit of claim 25 further including:
a first tuning inductor electrically connected in series between the first passive switch and the first blocking capacitor.

27. The RF circuit of claim 24 further including:
a first blocking inductor electrically connected in parallel with the first reactive impedance;
wherein the first blocking inductor behaves as an open circuit to RF signals.

28. The RF circuit of claim 24 further including:
wherein the two or more switches include a second passive switch;
wherein the second passive switch includes a second cross-coupled PIN diode pair electrically connected between the first node and a fourth node;
wherein the third reactive impedance is electrically connected between the fourth node and the third node.

29. The RF circuit of claim 28 further including:
a first blocking capacitor electrically connected in series between the first passive switch and the third node; and
a second blocking capacitor electrically connected in series between the second passive switch and the fourth node;
wherein each of the first blocking capacitor and the second blocking capacitor behaves as a short circuit to RF signals.

30. The RF circuit of claim 29 further including:
a first tuning inductor electrically coupled in series between the first passive switch and the first blocking capacitor; and
a second tuning inductor electrically coupled in series between the second passive switch and the second blocking capacitor.

31. The RF circuit of claim 30 further including:
a first blocking inductor electrically connected in parallel with the first reactive impedance; and
a second blocking inductor electrically connected in parallel with the third reactive impedance;
wherein each of the first blocking inductor and the second blocking inductor behaves as an open circuit to RF signals.

32. The RF circuit of claim 24 further including:
a reactive element electrically connected in parallel with the first end portion of the transmission line, between a fifth node at the signal conductor of the transmission line and a sixth node at a relative ground of the transmission line.

* * * * *